United States Patent [19]

King

[11] Patent Number: 4,475,014

[45] Date of Patent: Oct. 2, 1984

[54] ACOUSTICAL TRANSDUCER

[75] Inventor: John A. King, Martinsville, Ind.

[73] Assignee: Harman-Motive Inc., Northridge, Calif.

[21] Appl. No.: 417,079

[22] Filed: Sep. 13, 1982

[51] Int. Cl.³ .............................................. H04R 17/00
[52] U.S. Cl. .................. 179/110 A; 310/332; 310/334
[58] Field of Search ................. 179/110 A; 310/332, 310/334, 338, 344

[56] References Cited

U.S. PATENT DOCUMENTS

| 3,047,749 | 7/1962 | Fisher | 310/344 |
| 3,173,035 | 3/1965 | Fisher | 310/344 |
| 3,222,462 | 12/1965 | Karmann et al. | 310/334 |
| 3,390,287 | 6/1968 | Sonderegger | 310/338 |
| 3,676,722 | 7/1972 | Schafft | 310/332 |
| 4,237,399 | 12/1980 | Sakamoto | 310/332 |
| 4,283,605 | 8/1981 | Nakajima | 179/110 A |
| 4,283,649 | 8/1981 | Henouchi | 179/110 A |

FOREIGN PATENT DOCUMENTS 952476  11/1956  Fed. Rep. of Germany ...... 310/332

Primary Examiner—Gene Z. Rubinson
Assistant Examiner—Danita R. Byrd
Attorney, Agent, or Firm—Barnes & Thornburg

[57] ABSTRACT

A bimorph bender acoustical transducer driver or motor element in which no center vane is necessary. Elimination of the vane reduces the dynamic mass of the driver so that a thicker, more rugged piezoelectric wafer can be used to achieve the same acoustical response characteristics as were possible with prior art drivers having vanes and thinner piezoelectric wafers subject to damage.

11 Claims, 4 Drawing Figures

ACOUSTICAL TRANSDUCER

This invention relates to acoustical transducers, and more specifically to an improved structure for a piezoelectric bender.

Bimorph benders are known to be useful as motor elements or drivers in acoustical transducers. There is, for example, the structure disclosed in U.S. Pat. No. 3,676,722. Structures of this type include a conductive vane sandwiched between typically circular piezoelectric wafers. The faces of both piezoelectric wafers are typically coated with a silver-nickel, or other conductive, coating out to near their edges. Typically, one surface of each wafer is fixed, illustratively by conductive epoxy, to a surface of the vane. The vane provides not only a stiffening member for the bender, but also a mechanism by which electrical contact can be made with the faces of the wafers attached to the vane. Separate contacts are brought out from the outwardly facing sides of the two wafers. These three contacts, then, provide the mechanism by which the bender is excited from a source of electrical engergy at an audio frequency.

Analysis of the dynamics of bimorph benders with a conductive vane sandwiched between the piezoelectric wafers indicates that the presence of a vane affects the acoustical performance of the benders. At the present, a conductive vane is necessary where a single piezoelectric wafer is used, i.e., a structure commonly referred to as a "one-half bimorph" structure, in order for the wafer to assume a "cupping" mode when excited from an audio frequency electrical source. However, if an electrical connection could be made to the interface between the two piezoelectric wafers in a bimorph bender, the conductive vane could be eliminated. For example, the use of a tab, typically a foil, extending into the interface between the wafers has been proposed as a means providing electrical access to the interface. There are several problems associated with the use of a tab. One of these problems is the difficulty in assembling the bender, thus adding to its cost. Further, a thicker adhesive bond is required between the wafers to accommodate the thickness of the tab. This adds to the dynamic mass of the bender and thus results in lower sensitivity.

According to the invention, the vane or foil is eliminated from the bimorph structure. Elimination of a vane or tab from the structure reduces the dynamic mass of the motor element or driver so that a thicker, more rugged piezoelectric wafer can be used to achieve an acoustical response characteristic. According to an illustrative embodiment of the present invention, 0.0075" (0.19 mm) thick piezoelectric wafers can be used to achieve the same sensitivity as 0.005" (0.127 mm) thick piezoelectric wafers could achieve in a prior art wafer-vane-wafer sandwich construction. The electrical power-handling capability of the thicker piezoelectric wafer elements, which the present invention permits a device builder to use, is higher than the power-handling capability available with thinner prior art piezoelectric wafer motor elements. These higher sensitivity and power-handling capability effects are achieved, while at the same time the frequency response with the thicker elements is unaffected, due to the elimination of the vane.

According to the invention, a piezoelectric bender includes first and second piezoelectric crystals, each having first and second opposed side surfaces. The bender further includes means providing electrical couplings to the first sides of the first and second crystals, and means providing an electrical coupling to the second sides of the first and second crystals. A layer of adhesive cements the periphery of the second side of the first crystal to the periphery of the second side of the second crystal.

According to an illustrative embodiment of the invention, the means providing an electrical coupling to the second sides of the first and second crystals comprises a conductive adhesive. Illustratively, the conductive adhesive is a silver-filled epoxy.

Further according to an illustrative embodiment of the present invention, the first and second crystals are generally flat circular wafers. The means for providing an electrical coupling to the second sides of the first and second crystals further comprises means providing a notch in the perimeter of the first wafer for exposing a region of the second side of the second wafer near its perimeter. An electrical contact is provided on the exposed region.

Additionally according to illustrative embodiments of the invention, the adhesive cementing the periphery of the second side of the first crystal to the periphery of the second side of the second crystal is a so-called solventless adhesive. According to illustrative embodiments, this adhesive may be a cyanoacrylate or an epoxy.

Additionally according to the present invention, a piezoelectric acoustic transducer comprises first and second piezoelectric crystals, each having first and second opposed side surfaces. The driver further includes means providing electrical couplings to the first sides of the first and second crystals, and means providing an electrical coupling to the second sides of the first and second crystals. The means providing an electrical coupling to the second sides of the first and second crystals comprises a conductive adhesive, such as a silver-filled epoxy, and means providing a notch in the perimeter of one of the first and second crystals for exposing a region of the second side of the other of the first and second crystals near its perimeter. An electrical contact is provided on the exposed region. The driver also includes a layer of adhesive cementing the perimeter of the second side of the first crystal and the perimeter of the second side of the second crystal, a diaphragm, and means for coupling the diaphragm to the first side of the first crystal.

Further according to the invention, means are provided for supporting the periphery of the diaphragm and the nodal diameters of the first and second crystals in a relatively fixed orientation to each other.

The invention may best be understood by referring to the following description and accompanying drawings which illustrate the invention. In the drawings.

Figure 1:
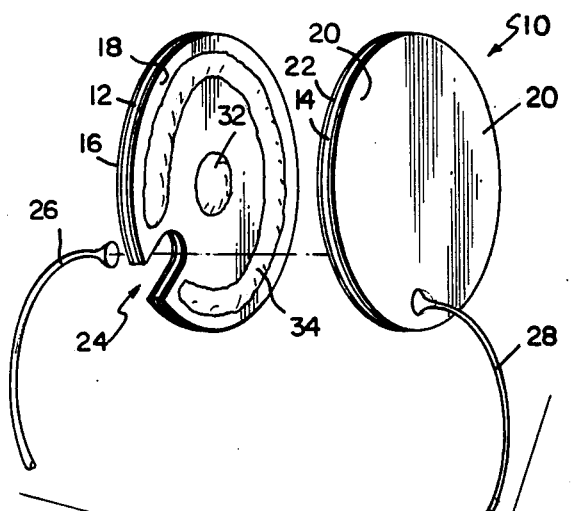
FIG. 1 is a perspective view of the components of a bimorph bender constructed according to the present invention, prior to assembly.
Figure 2:
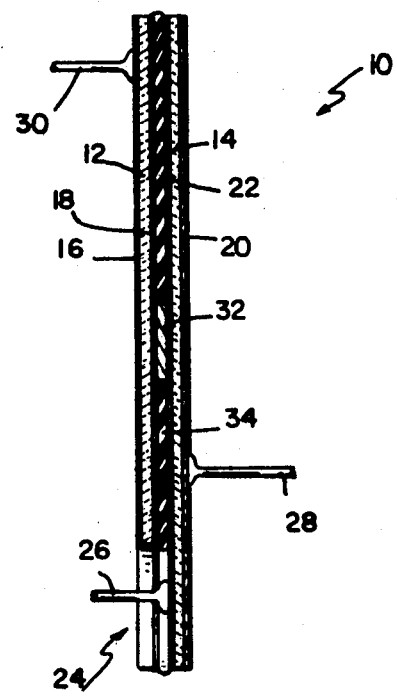
FIG. 2 is a sectional view of the completed assembly taken generally through a diameter of the joined crystals of the bender.

Turning now to FIGS. 1 and 2, a bimorph bender constructed according to the present invention includes a generally circular wafer 12 of piezoelectric material and a generally circular wafer 14 of piezoelectric material. Wafer 12 has a conductive coating 16 on a first face and a conductive coating 18 on a second face thereof. Wafer 14 has a conductive coating 20 on a first face and a conductive coating 22 on a second face thereof. The coatings do not extend over the edges of the wafers 12, 14. Thus, the first and second faces of the wafers 12, 14 are electrically insulated from each other. The coatings can be placed onto the wafers 12, 14 by any of a number of known techniques.

Wafer 12 is provided with a radially and peripherally extending notch 24 at its periphery to permit coupling of a conductor 26 to the conductive coating 22 on the second face of wafer 14. Additional conductors 28, 30 are coupled to the conductive coating 20 on the first face of wafer 14 and to the conductive coating 16 on the first face of wafer 12, respectively. To couple the conductive coatings 18, 22 on the second faces of wafers 12, 14, respectively, and to join the two wafers together, a combination of a small amount 32 of a conductive material and a somewhat larger amount 34 of a suitable adhesive is placed on the second face 18 of wafer 12. Wafers 12, 14 are then pressed together until the adhesive sets sufficiently to hold them rigidly together. Typically, the material 32 can be a silver-filled epoxy or like material. The conductive material in the material 32 couples the conductive coatings 18, 22 on the second faces of crystals 12, 14 together. The material 34 can be an adhesive of the "solventless" type, such as an epoxy or cyanoacrylate, which cures without releasing any solvent. These types of materials are generally favored in this application, since the adhesive 34 must cure completely in the space between surfaces 18, 22. An electrically non-conductive material 34 is preferred, since there is some spreading of the material when the wafers 12, 14 are pressed together, and invariably some small amount of this material is squeezed from between the peripheral edges of the wafers 12, 14. Since shorting of the coatings 16, 18 or 20, 22 together is to be avoided, a non-conductive adhesive facilitates this assembly operation by cementing the peripheral area that extends radially outwardly from the conductive adhesive.

Figure 3:
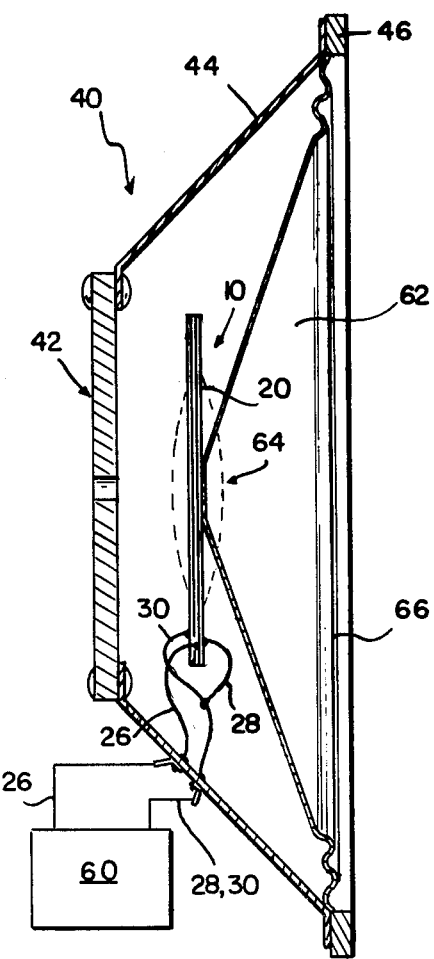
FIG. 3 is a sectional view taken generally through a diameter of a speaker in which a bender constructed according to the present invention is used as a driver for the speaker diaphragm.

Turning now to FIG. 3, an audio speaker utilizing the bender 10 of FIGS. 1 and 2 as a driver is illustrated. The speaker includes a frame 40 which comprises a back plate 42, a spider 44, and a mounting ring 46. The bender 10 flexes freely generally to the positions illustrated in broken lines when excited from an audio source 60 through conductors 26, 28, 30. A speaker diaphragm or cone 62 is attached at its apex 64 to surface 20 of bender 10. Illustratively, the attachment can be achieved utilizing an epoxy or other suitable adhesive. The cone 62 is attached at its outer periphery by means of a conventional bellows-type suspension 66 to the frame 40. Excitation of the bender 10 from the source 60 causes crystals 12, 14 alternately to assume their "cupping" or "oil canning" modes, as illustrated in broken lines, driving the cone 62 to convert the electrical signal on conductors 26, 28, 30 to an audio signal. The bender 10 is supported only by the speaker cone 62, and thus operates in an "inertial" mode when excited from audio frequency electrical signal source 60.

Figure 4:
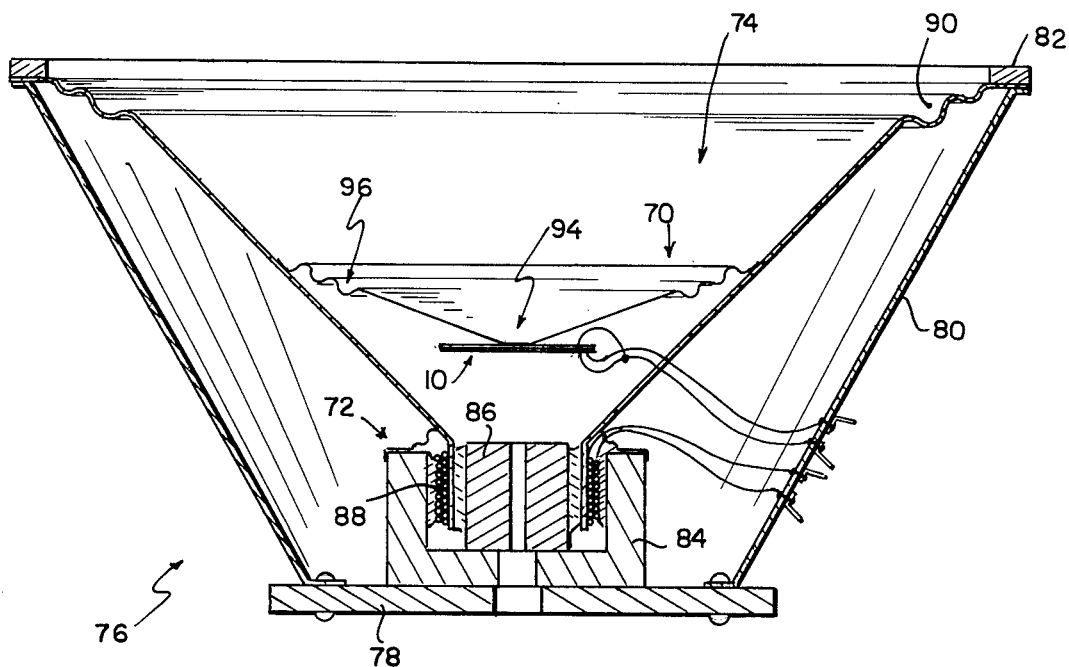
FIG. 4 is a sectional view taken generally through a diameter of a so-called "coaxial" speaker in which the bimorph bender constructed according to the present invention is mounted.

Turning now to FIG. 4, a coaxial speaker including a bimorph bender driver which drives a tweeter cone 70, and a conventional voice coil structure 72 which drives a woofer cone 74 is illustrated. This structure includes a supporting frame 76 comprising back plate 78, spider 80, and mounting ring 82. Pole pieces 84, 86 are associated with the voice coil 88 which drives the woofer cone 74. Cone 74 is attached at its periphery by a suspension 90 to the frame 76. The tweeter cone 70 is attached at its apex 94 to a working surface of the bender 10. The bender 10 is supported only by the tweeter cone 70 and operates in an inertial mode when excited from an audio frequency electrical source to drive the tweeter cone 70. The cone 70 is coupled by a suspension 96 to the interior of the woofer cone 74. The suspension 96 serves as an acoustical low-pass filter, so that the low frequencies which excite the voice coil 88 and drive the woofer cone 74 cause the tweeter cone 70 also to be moved. However, the high frequencies which drive the bender 10 and thus the tweeter cone 70 are not transmitted through the suspension 96 to the woofer cone 74.

As used in this specification, the term "crystal" includes not only the naturally occurring crystalline piezoelectric materials, but also other piezoelectric materials as well. Examples of such other materials would be certain polycrystalline ceramic materials.

What is claimed is:

1. A bender comprising a first piezoelectric crystal having first and second opposed side surfaces, a second piezoelectric crystal having first and second opposed side surfaces, means providing an electrical coupling to the first side of the first crystal, means providing an electrical coupling to the first side of the second crystal, means providing an electrical coupling to the second sides of the first and second crystals, the last-mentioned coupling means including means providing a notch in the perimeter of the first crystal for exposing a region of the second side of the second crystal near its perimeter and an electrical contact provided on the exposed region, and a layer of adhesive cementing the perimeter of the second side of the first crystal to the perimeter of the second side of the second crystal.

2. The bender of claim 1 wherein said means providing an electrical coupling to the second sides of the first and second crystals comprises a conductive adhesive.

3. The bender of claim 2 wherein the conductive adhesive is a silver-filled epoxy.

4. The bender of claim 1 or 3 wherein the first and second crystals are generally flat circular wafers of piezoelectric material.

5. The bender of claim 1 wherein the adhesive comprises a cyanoacrylate.

6. The bender of claim 1 wherein the adhesive comprises an epoxy.

7. A piezoelectric acoustic transducer comprising first and second piezoelectric crystals, each having first and second opposed side surfaces, means providing an electrical coupling to the first side of the first crystal, means providing an electrical coupling to the first side of the second crystal, means providing an electrical coupling to the second sides of the first and second crystals, the means for providing an electrical coupling to the second sides of the crystals including means providing a notch in the perimeter of one of the first and second crystals for exposing a region of the second side of the other of the first and second crystals near its perimeter and an electrical contact provided on the exposed region, a layer of adhesive cementing the perimeter of the second side of the first crystal and the perimeter of the second side of the second crystal, an acoustical transducer diaphragm, and means for coupling the diaphragm to the first side of the first crystal.

8. The transducer of claim 7 wherein said means providing an electrical coupling to the second sides of the first and second crystals comprises a conductive adhesive.

9. The transducer of claim 7 or 8 wherein the first and second crystals are generally flat circular wafers of piezoelectric material.

10. An acoustic transducer comprising first and second piezoelectric crystals, each having first and second opposed side surfaces, means providing an electrical coupling to the first side of the first crystal, means providing an electrical coupling to the first side of the second crystal, a conductive adhesive between the second sides of the first and second crystals, means providing an electrical coupling to the second side of one of the first and second crystals, a layer of non-conductive adhesive extending perimetrally around the layer of conductive adhesive for cementing the perimeter of the second side of the first crystal and the perimeter of the second side of the second crystal to electrically isolate the conductive adhesive, a diaphragm, means for supporting the diaphragm, and means for coupling a region of the diaphragm to the first side of the first crystal.

11. A bender consisting essentially of a first piezoelectric crystal having first and second opposed side surfaces, a second piezoelectric crystal having first and second opposed side surfaces, means providing an electrical coupling to the first side of the first crystal, means providing an electrical coupling to the first side of the second crystal, means providing an electrical coupling to the second sides of the first and second crystals, and a layer of adhesive cementing the perimeter of the second side of the first crystal to the perimeter of the second side of the second drystal, one of the first and second crystals including means providing an access passageway through said one of the first and second crystals exposing a region of the second surface of the other of the first and second crystals, the means providing an electrical coupling to the second sides including means providing an electrical coupling to the region exposed through said access providing means.

* * * * *